US012738712B2

(12) United States Patent
Kurosaki et al.

(10) Patent No.: US 12,738,712 B2
(45) Date of Patent: Sep. 15, 2026

(54) LASER OSCILLATOR AND DIRECT DIODE LASER PROCESSING APPARATUS PROVIDED WITH SAME

(71) Applicant: Panasonic Intellectual Property Management Co., Ltd., Osaka (JP)

(72) Inventors: Yuta Kurosaki, Osaka (JP); Masashi Samizo, Hyogo (JP); Shunsuke Nakai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 565 days.

(21) Appl. No.: 18/229,885

(22) Filed: Aug. 3, 2023

(65) Prior Publication Data

US 2023/0378717 A1 Nov. 23, 2023

Related U.S. Application Data

(63) Continuation of application No. PCT/JP2022/006411, filed on Feb. 17, 2022.

(30) Foreign Application Priority Data

Feb. 19, 2021 (JP) ................................ 2021-025613

(51) Int. Cl.
*H01S 5/0683* (2006.01)
*H02M 3/28* (2006.01)

(52) U.S. Cl.
CPC ............ *H01S 5/0683* (2013.01); *H02M 3/28* (2013.01)

(58) Field of Classification Search
CPC ...... H01S 5/042; H01S 5/0427; H01S 5/0428; H01S 5/0683
See application file for complete search history.

(56) References Cited

U.S. PATENT DOCUMENTS 5,412,675 A * 5/1995 Odagawa ............. H01S 5/4025 372/50.1
2004/0136429 A1 * 7/2004 Krupke .................. H01S 3/094 372/55
2011/0148319 A1 6/2011 Terazawa
(Continued)

FOREIGN PATENT DOCUMENTS

CN 110535028 A * 12/2019 .......... G01S 7/4804
JP 4-217877 8/1992
(Continued)

OTHER PUBLICATIONS

Translation of CN-110535028 (Year: 2019).*
(Continued)

*Primary Examiner* — Xinning(Tom) Niu
(74) *Attorney, Agent, or Firm* — Wenderoth, Lind & Ponack, L.L.P.

(57) ABSTRACT

A control unit is configured to perform stop control of causing a power supply circuit to stop supplying a supply current, if the supply current is determined to exceed a threshold, determine whether an input alternating current (AC) voltage is abnormal, with supply of the supply current to the power supply circuit stopped by the stop control, and cause the power supply circuit to resume supplying the supply current, if the input AC voltage is determined not to be abnormal.

11 Claims, 4 Drawing Sheets

(56) References Cited

U.S. PATENT DOCUMENTS

2015/0005612 A1* 1/2015 Suzuki .................. H01S 3/0912
600/407
2016/0285389 A1* 9/2016 Sakai .................. H01S 5/06817
2020/0287460 A1* 9/2020 Samizo .............. H05B 45/3725
2022/0158409 A1* 5/2022 Zeng ................... H01S 5/06804

FOREIGN PATENT DOCUMENTS

JP 2010-57331 3/2010
JP 2014-93396 5/2014
JP 2014-206901 10/2014
JP 6211259 10/2017

OTHER PUBLICATIONS

International Search Report issued Apr. 19, 2022 in International Application No. PCT/JP2022/006411, with partial English translation.

* cited by examiner 100
40
W
LB4
50
10
20
13
12
CONTROLLER
90
CONTROL DEVICE
60
POWER SUPPLY DEVICE
70
Z
Y
X 70
200
71
75
70b
73
72
72a
72b
72c
72d
72e
77
76
76a
76b
78
78a
78b
79
70d
70c
80a
80b
N1
N2
70a
30
31
POWER SUPPLY CIRCUIT
70e
CONTROL UNIT
68a
68b
68c
68d
67a
67b
67c
67d
601
66
65
64
63
62
613
612
611
61
CALCULATION UNIT

LASER OSCILLATOR AND DIRECT DIODE LASER PROCESSING APPARATUS PROVIDED WITH SAME

CROSS-REFERENCE TO RELATED APPLICATIONS

This is a continuation of International Application No. PCT/JP2022/6411 filed on Feb. 17, 2022, which claims priority to Japanese Patent Application No. 2021-025613 filed on Feb. 19, 2021. The entire disclosures of these applications are incorporated by reference herein.

BACKGROUND

The present disclosure relates to a laser oscillator including a light-emitting circuit and a power supply circuit configured to supply a supply current to the light-emitting circuit, using a predetermined input AC voltage; and a direct diode laser processing machine including the laser oscillator.

Japanese Patent No. 6211259 discloses a laser oscillator including: a light-emitting circuit including a laser diode; a power supply circuit configured to supply a supply current to the light-emitting circuit, using a predetermined input AC voltage; and a control unit configured to control the power supply circuit. The laser oscillator further includes a current measurement unit configured to measure the supply current. The control unit causes the power supply circuit to stop supplying the supply current, if the supply current measured by the current measurement unit is abnormal.

SUMMARY

Japanese Patent No. 6211259 described above neither teaches nor suggests preparing any means for checking the presence or absence of anomaly or malfunction and safely and quickly resuming operation, after the laser oscillator has stopped supplying the supply current, if an abnormal supply current occurs due to an instantaneous fluctuation of the input AC voltage or temporary noise generated in the current or voltage in the laser oscillator. This causes a shorter operation period and a large amount of effort of users required for inspection and operation.

The present disclosure was made in view of the problems. It is an objective of the present disclosure to check the presence or absence of anomaly or malfunction, safely and quickly resume operation, and increase the operation period of the machine.

In order to achieve the objective, the present disclosure provides a laser oscillator including: a light-emitting circuit including at least one laser diode; a power supply circuit configured to supply a supply current to the light-emitting circuit, using a predetermined input AC voltage; and a control unit configured to control the power supply circuit. The laser oscillator further includes: a first voltage measurement unit configured to measure a voltage corresponding to the input AC voltage; a current measurement unit configured to measure a current corresponding to the supply current; and a second voltage measurement unit configured to measure a voltage corresponding to a voltage of the light-emitting circuit. The control unit executes; current determination of determining whether the supply current exceeds a predetermined threshold, based on a value measured by the current measurement unit; first current control of: performing stop control of causing the power supply circuit to stop supplying the supply current, if the supply current is determined, in the current determination, to exceed the predetermined threshold; and causing the power supply circuit to continue supplying the supply current, if the supply current is determined, in the current determination, not to exceed the predetermined threshold; second current control of: determining whether or not the input AC voltage is abnormal, based on a value measured by the first voltage measurement unit, with supply of the supply current to the power supply circuit stopped by the stop control; causing the power supply circuit to resume supplying the supply current, if the input AC voltage is determined not to be abnormal; and causing the power supply circuit to keep stopping the supply of the supply current, if the input AC voltage is determined to be abnormal.

In this procedure, once the input AC voltage is back to normal after the supply of the supply current has been stopped by the first current control, the supply of the supply current can be resumed by the second current control. When the supply current becomes the overcurrent due to an instantaneous fluctuation of the input AC voltage or temporary noise generated in the current or voltage in the laser oscillator, the laser oscillator can stop the supply of the supply current, and then check that the input AC voltage is normal and resume the supply. This can result in a longer operation period and less effort of users required for inspection and operation.

Until the input AC voltage is back to normal after the supply of the supply current has been stopped by the first current control, the laser oscillator keeps stopping the supply of the supply current under the second current control. The supply current is thus less likely to be the overcurrent again due to the abnormal input AC voltage.

The present disclosure can increase the operation period of a laser oscillator and reduce the effort of users required for inspection and operation.

DETAILED DESCRIPTION

An embodiment of the present disclosure will be described below with reference to the drawings. The following description of an advantageous embodiment is a mere example in nature, and is not at all intended to limit the scope, applications or use of the present invention.

Figure 1:
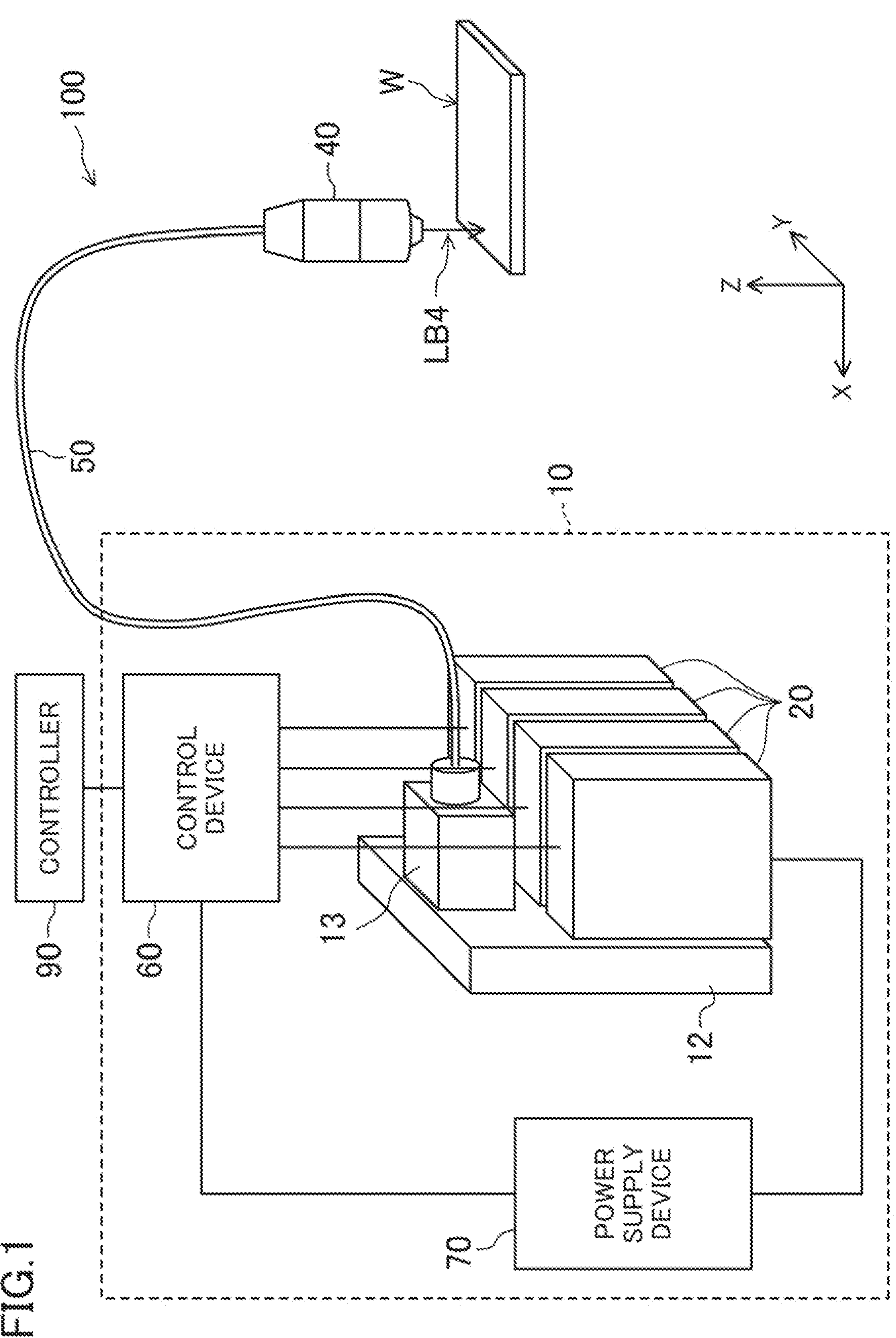
FIG. 1 is a schematic diagram showing a configuration of a direct diode laser processing machine including a laser oscillator according to an embodiment of the present disclosure.

As shown in FIG. 1, a direct diode laser (DDL) processing machine 100 according to this embodiment includes a laser oscillator 10, a laser-emitting head 40, transmission fibers 50, and a controller 90.

The laser oscillator 10 includes a plurality of laser devices 20, a beam combiner 12, a condensing unit 13, a control device 60, and a power supply device 70.

Figure 2:
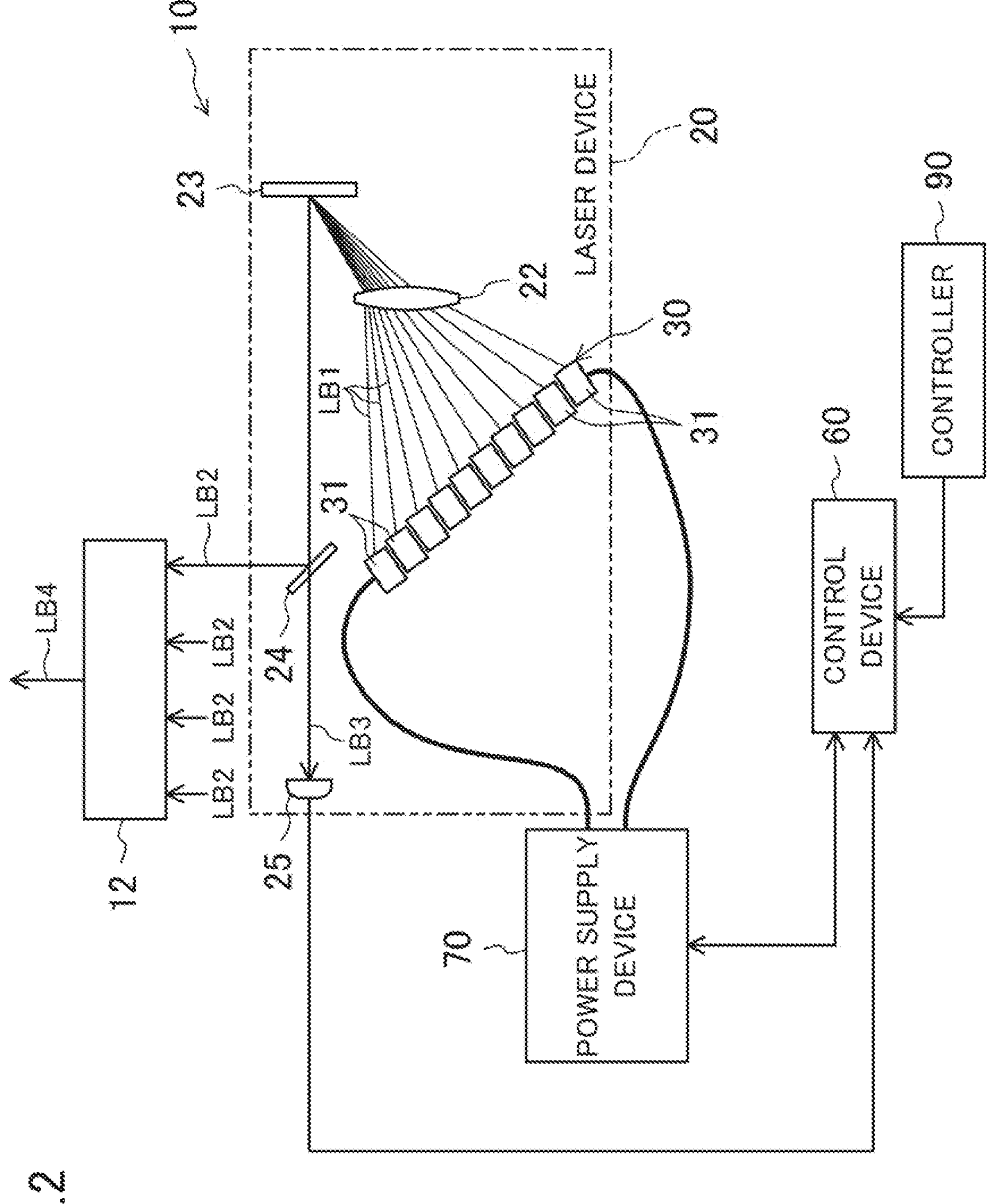
FIG. 2 is a schematic diagram showing a configuration of the laser oscillator according to the embodiment of the present disclosure.

As shown in FIG. 2, each laser device 20 includes: a light-emitting circuit 30, a condensing lens 22 as a laser optical system, a reflecting mirror (diffraction grating) 23, a beam splitter 24, and a photodiode 25. The light-emitting circuit 30 includes, for example, ten laser diode bars 31 having different wavelengths and configured to emit laser beams LB1. The condensing lens 22 condenses the laser beams LB1 emitted from the ten laser diode bars 31. The reflecting mirror 23 reflects the laser beams emitted by the condensing lens 22. The beam splitter 24 reflects part of the laser beams emitted from the reflecting mirror 23 as laser beam LB2, while transmitting the rest of the laser beams as laser beam LB3. The photodiode 25 receives the laser beam LB3 transmitted through the beam splitter 24 and outputs a signal corresponding to the intensity of the laser beam LB3.

Each laser diode bar 31 is a semiconductor laser array of a plurality of laser diodes arranged in parallel, each including emitters. The number of emitters included in each laser diode bar 31 is set to 50, for example. The ten laser diode bars 31 are connected to each other in series.

The beam combiner 12 combines the laser beams LB2 emitted from the plurality of laser devices 20 into one laser beam LB4 and emits the laser beam LB4 to the condensing unit 13.

The condensing unit 13 includes therein a condensing lens (not shown) configured to condense the incident laser beam LB4, which is reduced in beam diameter at a predetermined magnification and is incident on the transmission fibers 50. The condensing unit 13 also includes a connector (not shown), which is connected to incident ends of the transmission fibers 50.

The laser oscillator 10 with such a configuration outputs a laser beam at a high power over several kW. While the laser oscillator 10 includes four laser devices 20 in this embodiment, the number is not particularly limited thereto. For example, the laser oscillator 10 may include only one laser device 20 to output a laser beam LB2 which may be directly incident on the transmission fibers 50. The number of the laser devices 20 to be mounted can be changed as appropriate depending on the output specifications required for the direct diode laser processing machine 100 or the output specifications of the laser devices 20.

The transmission fibers 50 are optically coupled to the condensing lens of the condensing unit 13 and guides the laser beam LB4 received from the laser oscillator 10 to the laser-emitting head 40.

The laser-emitting head 40 emits the laser beam LB4 guided by the transmission fibers 50 toward, for example, a workpiece W at a predetermined position. In this manner, the workpiece W is subject to laser processing.

The control device 60 generates a command current value for each of the laser devices 20 based on the signal output by the photodiode 25 so that the output power of the laser beam LB2 emitted from the laser device 20 reaches a predetermined target value, and outputs the command current value to the power supply device 70. The control device 60 calculates the target value of the output power of the laser beam LB2, based on a command signal, which will be described later, output by the controller 90. The control device 60 outputs an ON signal, while the controller 90 outputs an output instruction, which will be described later.

The power supply device 70 supplies a current for causing a laser oscillation to each of the laser devices 20, based on the command current value output by the control device 60.

Figure 3:
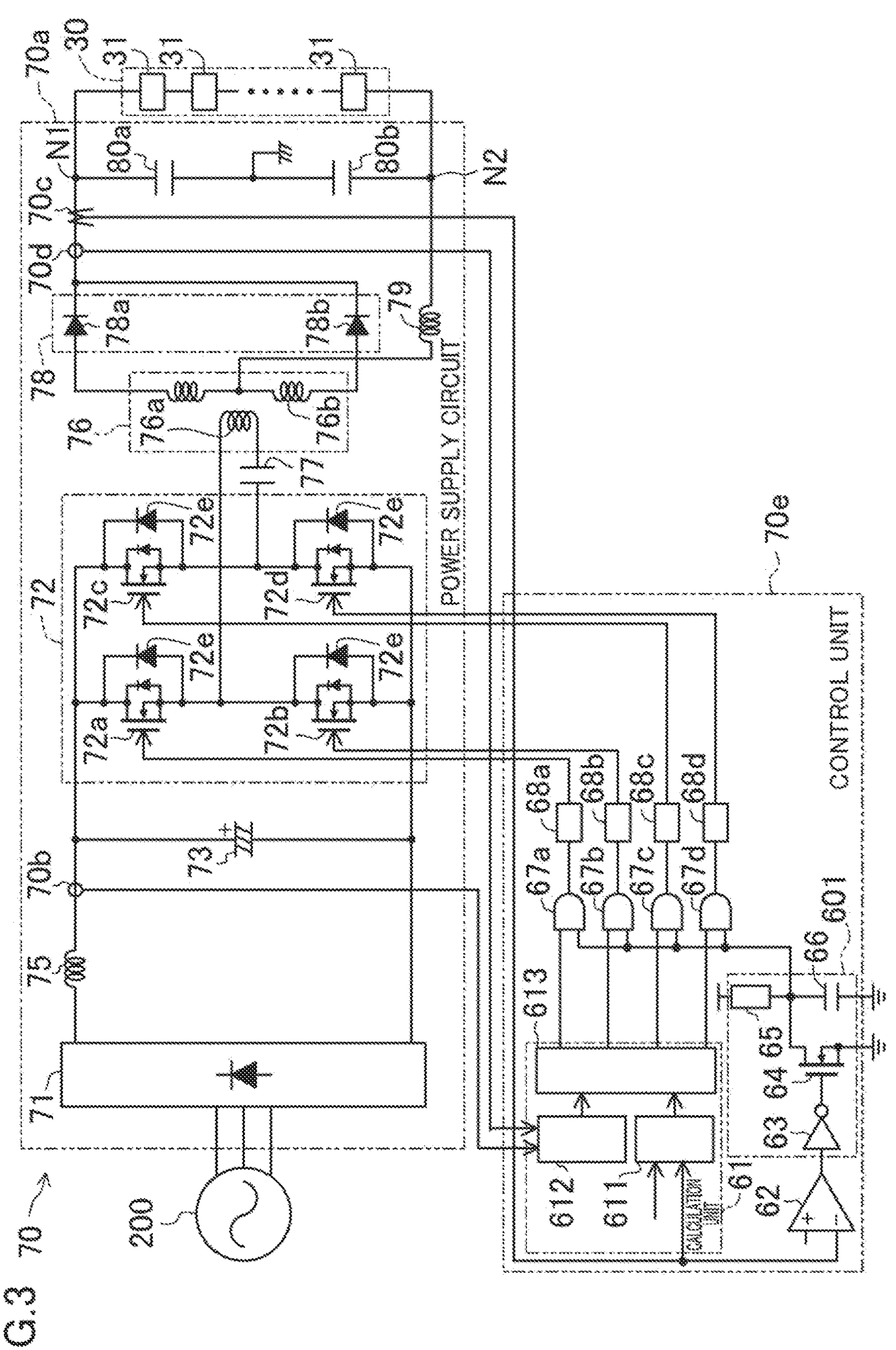
FIG. 3 is a circuit diagram showing configurations of a light-emitting circuit and a power supply device.

As shown in FIG. 3, the power supply device 70 includes, for each laser device 20, a power supply circuit 70*a*, a first voltage measurement unit 70*b*, a current measurement unit 70*c*, a second voltage measurement unit 70*d*, and a control unit 70*e*.

The power supply circuit 70*a* supplies a supply current to the light-emitting circuit 30, using a three-phase input AC voltage input from an AC power supply 200.

Specifically, the power supply circuit 70*a* includes a primary rectifier circuit 71, an inverter circuit 72, a DC-link capacitor 73, a first reactor 75, an isolation transformer 76, a first capacitor 77, a secondary rectifier circuit 78, a second reactor 79, first and second capacitors 80*a* and 80*b*, and first and second current supply nodes N1 and N2.

The primary rectifier circuit 71 converts an input AC voltage input from the AC power supply 200 into a DC voltage and outputs the DC voltage. The primary rectifier circuit 71 is, for example, a diode bridge.

The inverter circuit 72 includes a pair of input nodes, a first upper-arm switching element 72*a* and a first lower-arm switching element 72*b* connected in series between the input nodes, and a second upper-arm switching element 72*c* and a second lower-arm switching element 72*d* connected in series between the input nodes. A freewheeling diode 72*e* is connected in parallel to the switching elements 72*a* to 72*d*. The inverter circuit 72 converts the DC voltage output from the primary rectifier circuit 71 into a primary AC voltage by switching operations of the switching elements 72*a* to 72*d*.

The DC-link capacitor 73 is connected between the input nodes of the inverter circuit 72.

The first reactor 75 is connected between the positive output terminal of the primary rectifier circuit 71 and the positive electrode of the DC-link capacitor 73 (i.e., one of the input nodes of the inverter circuit 72).

The isolation transformer 76 converts the primary AC voltage output by the inverter circuit 72 into a secondary AC voltage. The isolation transformer 76 includes a primary coil 76*a* and a secondary coil 76*b*. The voltage of the primary coil 76*a* serves as a primary AC voltage, while the voltage of the secondary coil 76*b* serves as a secondary AC voltage. The primary coil 76*a* has one end connected to a connecting point between the first upper-arm switching element 72*a* and the first lower-arm switching element 72*b*. The primary coil 76*a* has the other end connected to a connecting point between the second upper-arm switching element 72*c* and the second lower-arm switching element 72*d* via the first capacitor 77.

The secondary rectifier circuit 78 generates a DC supply current, based on the secondary AC voltage according to the primary AC voltage. Specifically, the secondary rectifier circuit 78 includes second and third diodes 78*a* and 78*b*. The second diode 78*a* has an anode connected to one end of the secondary coil 76*b*, while the third diode 78*b* has an anode connected to the other end of the secondary coil 76*b*. The second and third diodes 78*a* and 78*b* each have a cathode connected to the first current supply node N1.

In this manner, the inverter circuit 72 is insulated from the secondary rectifier circuit 78 by the isolation transformer 76.

The second reactor 79 is connected between an intermediate point of the secondary coil 76*b* and the second current supply node N2.

The first and second capacitors 80*a* and 80*b* are connected in series between the first and second current supply nodes N1 and N2. The connecting point between the first and second capacitors 80*a* and 80*b* is grounded.

The light-emitting circuit 30 is connected between the first and second current supply nodes N1 and N2.

The first voltage measurement unit 70*b* measures the voltage of the positive electrode of the DC-link capacitor 73 (i.e., the voltage of one of the input nodes of the inverter circuit 72). The voltage of the positive electrode of the DC-link capacitor 73 corresponds to the input AC voltage input from the AC power supply 200.

The current measurement unit 70*c* measures a supply current to be supplied to the light-emitting circuit 30.

The second voltage measurement unit 70*d* measures the voltage of the first current supply node N1. The voltage of the first current supply node N1 corresponds to the voltage of the light-emitting circuit 30.

The control unit 70*e* controls the power supply circuit 70*a*. Specifically, the control unit 70*e* includes a calculation unit 61, a comparator 62, an invalidation signal output circuit 601, gate circuits 67*a* to 67*d*, and drive circuits 68*a* to 68*d*.

The calculation unit 61 outputs a switching signal to bring the value measured by the current measurement unit 70*c* closer to the command current value output by the control device 60. Specifically, the calculation unit 61 includes a feedback control unit 611, an enable signal generation unit 612, and a drive control unit 613. The function of the calculation unit 61 is fulfilled by a microcomputer. Some or all of the functions of the calculation unit 61 may be fulfilled utilizing an analog circuit, such as an integrated circuit (IC) dedicated to power supply or an operational amplifier.

The feedback control unit 611 outputs a control signal to bring the value measured by the current measurement unit 70*c* closer to the command current value output by the control device 60.

The enable signal generation unit 612 generates an enable signal, based on the values measured by the first and second voltage measurement units 70*b* and 70*d*. A detailed operation of the enable signal generation unit 612 will be described later.

While the enable signal generated by the enable signal generation unit 612 is at a high level, the drive control unit 613 outputs a switching signal according to the control signal output by the feedback control unit 611. On the other hand, while the enable signal is at a low level, the drive control unit 613 outputs a switching signal for turning off the switching elements 72*a* to 72*d*.

The comparator 62 determines whether the supply current exceeds a predetermined threshold, based on the value measured by the current measurement unit 70*c*. Specifically, the comparator 62 compares the value measured by the current measurement unit 70*c* to a predetermined threshold. If the measured value exceeds the predetermined threshold, the comparator 62 provides a low-level output. On the other hand, if the measured value does not exceed the predetermined threshold, the comparator 62 provides a high-level output.

The invalidation signal output circuit 601 includes a NOT circuit 63, a switching element 64 for invalidation signal generation, a resistor 65, and a capacitor 66.

The NOT circuit 63 inverts an output of the comparator 62 and provides the inverted output.

The switching element 64 for invalidation signal generation is an N-channel metal-oxide-semiconductor field-effect transistor (MOSFET). The switching element 64 for invalidation signal generation has a source connected to a reference potential point of the control unit 70*e*.

The resistor 65 and the capacitor 66 are connected in series in this order from the DC power supply between the DC power supply and the reference potential point of the control unit 70*e*. The connecting point between the resistor 65 and the capacitor 66 is connected to the drain of the switching element 64 for invalidation signal generation. The voltage at the connecting point between the resistor 65 and the capacitor 66 serves as an output of the invalidation signal output circuit 601.

Once the output of the comparator 62 becomes low, the switching element 64 for invalidation signal generation is turned on, via which the connecting point between the resistor 65 and the capacitor 66 is connected to the reference potential point of the control unit 70*e*. The voltage at the connecting point, that is, the output of the invalidation signal output circuit 601 at this time serves as an invalidation signal.

The time constant of the RC circuit including the resistor 65 and the capacitor 66 is set as follows. The period from when the switching element 64 for invalidation signal generation is turned from on to off to when the voltage at the connecting point between the resistor 65 and the capacitor 66 reaches a high level, that is, the invalidation signal is no longer output, is longer than the period from when the switching elements 72*a* to 72*d* of the inverter circuit 72 are turned off to when the supply current reaches zero.

The gate circuits 67*a* to 67*d* are each an AND circuit that receives a switching signal output by the drive control unit 613 and the voltage at the connecting point between the resistor 65 and the capacitor 66. That is, while the invalidation signal output circuit 601 outputs no invalidation signal, the gate circuits 67*a* to 67*d* output, as the ON/OFF signals, the switching signals output by the drive control unit 613 of the calculation unit 61. On the other hand, while the invalidation signal output circuit 601 outputs the invalidation signal, the gate circuits 67*a* to 67*d* output the ON/OFF signals indicating that the switching elements 72*a* to 72*d* are to be turned off.

The drive circuits 68*a* to 68*d* output drive signals for turning on and off the switching elements 72*a* to 72*d* of the inverter circuit 72 in response to the ON/OFF signals output from the gate circuits 67*a* to 67*d*.

The controller 90 receives an input indicating a laser output command value from a user and outputs, to the control device 60, a command signal indicating the command value. The controller 90 outputs an output instruction to the control device 60, when outputting a laser beam, in response to the input of the user.

Figure 4:
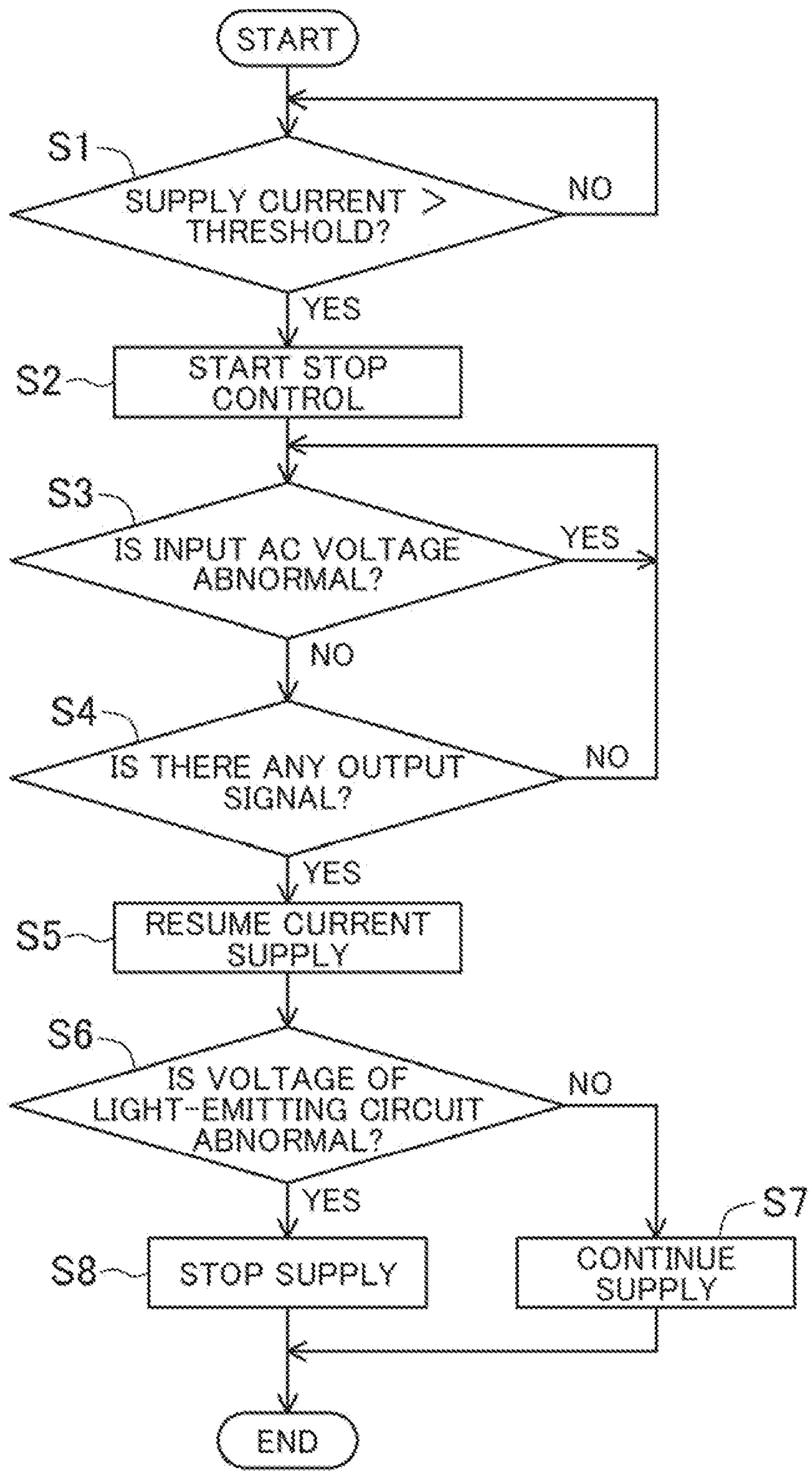
FIG. 4 is a flowchart showing an operation of a control unit.

Now, a detailed operation of the control unit 70*e* will be described with reference to the flowchart in FIG. 4.

First, while the power supply circuit 70*a* supplies a supply current to the light-emitting circuit 30, in step S1, the comparator 62 of the control unit 70*e* determines whether the supply current exceeds a predetermined threshold, based on a value measured by the current measurement unit 70*c*. If the comparator 62 determines that the supply current exceeds the predetermined threshold, that is, if the output of the comparator 62 is low, the process proceeds to step S2. On the other hand, if the comparator 62 determines that the supply current does not exceed the predetermined threshold, the power supply circuit 70*a* continues supplying the supply current and the determination in step S1 is executed again.

In step S2, in response to the output of the comparator 62 becoming low, the switching element 64 for invalidation signal generation is turned on, via which the connecting point between the resistor 65 and the capacitor 66 is connected to the reference potential point of the control unit 70*e*. That is, the invalidation signal output circuit 601 outputs an invalidation signal. The gate circuits 67*a* to 67*d* output ON/OFF signals indicating that the switching elements 72*a* to 72*d* of the inverter circuit 72 are to be turned off. Accordingly, the switching elements 72*a* to 72*d* are turned off so that the power supply circuit 70*a* stops supplying the supply current. In this manner, the control unit 70*e* performs the stop control of causing the power supply circuit 70*a* to stop supplying the supply current. The control unit 70*e* then starts the processing in step S3.

In step S3, the enable signal generation unit 612 determines whether the input AC voltage is abnormal, based on the value measured by the first voltage measurement unit 70*b*, with the supply of the supply current of the power supply circuit 70*a* stopped by the stop control in step S2. If the input AC voltage is not abnormal, the control unit 70*e* proceeds to the processing in step S4. On the other hand, if the input AC voltage is abnormal, the control unit 70*e* performs the determination in step S3 again, while causing the power supply circuit 70*a* to keep stopping the supply of the supply current.

In step S4, the control unit 70*e* determines whether the control device 60 outputs an ON signal. If the output ON signal is output, the process proceeds to step S5. On the other hand, if no ON signal is output, the determination in step S3 is performed again.

In step S5, the enable signal generation unit 612 generates a high-level enable signal. Accordingly, the switching elements 72*a* to 72*d* start the switching operations in response to the switching signals output by the calculation unit 61 so that the power supply circuit 70*a* resumes supplying the supply current. The control unit 70*e* then proceeds to the processing in step S6.

After the switching elements 72*a* to 72*d* have been turned off in step S2, the voltage of the capacitor 66 gradually rises due to a decrease in the supply current so that the invalidation signal is no longer output. The period from when the switching elements 72*a* to 72*d* are turned off in step S2 to when the invalidation signal is no longer output is longer than the period from when the switching elements 72*a* to 72*d* are turned off in step S2 to when the supply current measured by the current measurement unit 70*c* reaches zero. The stop control executed in step S2 is for turning off the switching elements 72*a* to 72*d* and continuing the off-state until the supply current reaches zero.

After causing the power supply circuit 70*a* to resume supplying the supply current in step S5, the enable signal generation unit 612 determines in step S6 whether the voltage of the light-emitting circuit 30 is abnormal, based on the value measured by the second voltage measurement unit 70*d*. If the voltage of the light-emitting circuit 30 is not abnormal, the process proceeds to step S7. On the other hand, if the voltage of the light-emitting circuit 30 is abnormal, the process proceeds to step S8.

In step S7, the enable signal generation unit 612 keeps generating the high-level enable signal, thereby causing the power supply circuit 70*a* to continue supplying the supply current.

In step S8, the enable signal generation unit 612 generates a low-level enable signal to stop the switching operations of the switching elements 72*a* to 72*d*, thereby causing the power supply circuit 70*a* to stop supplying the supply current.

In general, the high-output direct diode laser processing machine 100 is required to output a large supply current in a pulse shape of several kilo Hz, and the feedback control unit 611 performs highly responsive feedback control. When the input AC voltage drops instantaneously and is then back to normal, the feedback control for maintaining the level of the supply current tends to cause an excessive supply current (i.e., an overcurrent). According to this embodiment, if the supply current exceeds the predetermined threshold, the supply of the supply current is stopped by step S2, which reduces the long duration of the excessive supply current (i.e., the overcurrent).

According to this embodiment, once the input AC voltage is back to normal after the supply of the supply current has been stopped by step S2, the supply of the supply current can be automatically resumed by step S5. When the supply current becomes excessive (i.e., the overcurrent) due to an instantaneous fluctuation of the input AC voltage, as described above, or temporary noise generated in the current or voltage in the laser oscillator 10, the laser oscillator 10 can stop the supply of the supply current, and then check that the input AC voltage is normal and resume the supply. This can result in a longer operation period of the laser oscillator 10 and less effort of users required for inspection and operation.

Until the input AC voltage is back to normal after the supply of the supply current has been stopped by step S2, the laser oscillator 10 keeps stopping the supply of the supply current in accordance with the determination in step S3. The supply current is thus less likely to be excessive (i.e., the overcurrent) again due to the abnormal input AC voltage.

If the voltage of the light-emitting circuit 30 is abnormal even after the laser oscillator 10 has resumed supplying the supply current in step S5, a short-circuit failure of the light-emitting circuit 30 may have caused the overcurrent. In this case, the supply of the supply current is stopped by step S8, which reduces an enlargement of the damaged point due to a continuously flowing current through the malfunctioning light-emitting circuit 30.

In step S2, the supply of the supply current is stopped by turning off the switching elements 72*a* to 72*d* of the inverter circuit 72. This can quickly reduce a rise in the supply current, as compared to the case where the supply of the supply current is stopped by setting a target value used in the feedback control unit 611 to zero.

The stop control executed in step S2 is for continuing the off-state of the switching elements 72*a* to 72*d* until the supply current reaches zero. Accordingly, the drive of the switching elements 72*a* to 72*d* is resumed before the supply current reaches zero, which reduces bias magnetism and magnetic saturation of the isolation transformer 76.

The comparator 62, which is an analog circuit, determines whether the supply current exceeds the predetermined threshold. This can reduce the time lag from when the supply current actually exceeds the predetermined threshold to when the supply of the supply current stops, as compared to the case where the supply of the supply current is stopped by a computer executing a program.

In step S2, the supply of the supply current is stopped by the operations of the invalidation signal output circuit 601 and the gate circuits 67*a* to 67*d*. This can reduce the time lag from when the supply current actually exceeds the predetermined threshold to when the supply of the supply current stops, as compared to the case where the supply of the supply current is stopped by a computer executing a program.

Including the laser diode bars 31 connected in series in the embodiment described above, the light-emitting circuit 30 may include laser diodes connected in series or a single laser diode.

Directly measuring the supply current in the embodiment described above, the current measurement unit 70*c* may measure a current, at another point, corresponding to the supply current.

Measuring the voltage of the positive electrode of the DC-link capacitor 73 in the embodiment described above, the first voltage measurement unit 70*b* may directly measure at least one of the three-phase input AC voltages input from the AC power supply 200.

Measuring the voltage of the first current supply node N1 in the embodiment described above, the second voltage measurement unit 70*d* may directly measure the voltage of the light-emitting circuit 30 or the voltage, at another point, corresponding to the voltage of the light-emitting circuit 30.

In the embodiment described above, the stop control in S2 is achieved by the invalidation signal output circuit 601 and the gate circuits 67*a* to 67*d*, but may be achieved by a microcomputer. For example, once the microcomputer receives a signal indicating that the comparator 62 has detected an overcurrent, the enable signal generation unit 612 may output a low-level enable signal until the supply current measured by the current measurement unit 70*c* reaches zero after the switching elements 72*a* to 72*d* have been turned off in step S2. Alternatively, the drive control unit 613 may output a switching signal for turning off the switching elements 72*a* to 72*d* until the supply current measured by the current measurement unit 70*c* reaches zero.

As described above, the present disclosure provides highly practical advantages of increasing the operation period of a laser oscillator and reducing the effort of users required for inspection and operation. The present disclosure is thus significantly useful and highly industrially applicable.

What is claimed is:

1. A laser oscillator comprising:

a light emission circuit including at least one laser diode;

a power supply circuit configured to supply a supply current to the light emission circuit using an input alternating current (AC) voltage;

a control unit configured to control the power supply circuit;

a first voltage measurement unit configured to measure a voltage corresponding to the input AC voltage;

a second voltage measurement unit configured to measure a voltage corresponding to a voltage of the light emission circuit; and a current measurement unit configured to measure a current corresponding to the supply current, wherein the control unit is configured to execute:

current determination of determining whether the supply current exceeds a threshold, based on a value measured by the current measurement unit;

first current control of: performing stop control of causing the power supply circuit to stop supplying the supply current, if the supply current is determined, in the current determination, to exceed the threshold; and causing the power supply circuit to continue supplying the supply current, if the supply current is determined, in the current determination, not to exceed the threshold;

second current control of: determining whether or not the input AC voltage is abnormal, based on a value measured by the first voltage measurement unit, with supply of the supply current to the power supply circuit stopped by the stop control; causing the power supply circuit to resume supplying the supply current, if the input AC voltage is determined not to be abnormal; and causing the power supply circuit to keep stopping the supply of the supply current, if the input AC voltage is determined to be abnormal; and third current control of: determining whether the voltage of the light emission circuit is abnormal, based on a value measured by the second voltage measurement unit after causing the power supply circuit to resume supplying the supply current in the second current control; causing the power supply circuit to continue supplying the supply current, if the voltage of the light emission circuit is determined not to be abnormal; and causing the power supply circuit to stop supplying the supply current, if the voltage of the light emission circuit is determined to be abnormal.

2. A laser oscillator comprising:

a light emission circuit including at least one laser diode;

a power supply circuit configured to supply a supply current to the light emission circuit using an input AC voltage;

a control unit configured to control the power supply circuit;

a voltage measurement unit configured to measure a voltage corresponding to the input AC voltage; and a current measurement unit configured to measure a current corresponding to the supply current, wherein the control unit is configured to execute:

current determination of determining whether the supply current exceeds a threshold, based on a value measured by the current measurement unit;

first current control of: performing stop control of causing the power supply circuit to stop supplying the supply current, if the supply current is determined, in the current determination, to exceed the threshold; and causing the power supply circuit to continue supplying the supply current, if the supply current is determined, in the current determination, not to exceed the threshold; and second current control of: determining whether or not the input AC voltage is abnormal, based on a value measured by the first voltage measurement unit, with supply of the supply current to the power supply circuit stopped by the stop control; causing the power supply circuit to resume supplying the supply current, if the input AC voltage is determined not to be abnormal; and causing the power supply circuit to keep stopping the supply of the supply current, if the input AC voltage is determined to be abnormal, wherein the power supply circuit includes:

a primary rectifier circuit configured to convert the input AC voltage into a direct current (DC) voltage and output the DC voltage;

an inverter circuit including switching elements and being configured to convert the DC voltage output by the primary rectifier circuit into a primary AC voltage by switching operations of the switching elements;

a secondary rectifier circuit configured to generate the supply current, based on a secondary AC voltage according to the primary AC voltage; and an isolation transformer configured to insulate the inverter circuit from the secondary rectifier circuit, and wherein the stop control is for turning off the switching elements and maintaining an off-state until the supply current reaches zero.

3. The laser oscillator of claim 1, wherein the power supply circuit includes:

a primary rectifier circuit configured to convert the input AC voltage into a direct current (DC) voltage and output the DC voltage;

an inverter circuit including switching elements and being configured to convert the DC voltage output by the primary rectifier circuit into a primary AC voltage by switching operations of the switching elements;

a secondary rectifier circuit configured to generate the supply current, based on a secondary AC voltage according to the primary AC voltage; and an isolation transformer configured to insulate the inverter circuit from the secondary rectifier circuit, and wherein the stop control is for turning off the switching elements and maintaining an off-state until the supply current reaches zero.

4. The laser oscillator of claim 2, wherein the control unit includes a comparator configured to execute the current determination.

5. The laser oscillator of claim 3, wherein the control unit includes a comparator configured to execute the current determination.

6. The laser oscillator of claim 2, wherein the control unit includes:

a calculation unit configured to output a switching signal to bring the value measured by the current measurement unit closer to a target value;

an invalidation signal output circuit configured to output an invalidation signal, if the supply current is determined, in the current determination, to exceed the threshold; and a gate circuit configured to output, as an ON/OFF signal: (i) the switching signal output by the calculation unit, while the invalidation signal output circuit outputs no invalidation signal; or (ii) a signal indicating that at least one of the switching elements is to be turned off, while the invalidation signal output circuit outputs the invalidation signal, and the at least one of the switching elements is configured to be turned on or off in accordance with the ON/OFF signal.

7. The laser oscillator of claim 3, wherein the control unit includes:

a calculation unit configured to output a switching signal to bring the value measured by the current measurement unit closer to a target value;

an invalidation signal output circuit configured to output an invalidation signal, if the supply current is determined, in the current determination, to exceed the threshold; and a gate circuit configured to output, as an ON/OFF signal: (i) the switching signal output by the calculation unit, while the invalidation signal output circuit outputs no invalidation signal; or (ii) a signal indicating that at least one of the switching elements is to be turned off, while the invalidation signal output circuit outputs the invalidation signal, and the at least one of the switching elements is configured to be turned on or off in accordance with the ON/OFF signal.

8. The laser oscillator of claim 4, wherein the control unit includes:

a calculation unit configured to output a switching signal to bring the value measured by the current measurement unit closer to a target value;

an invalidation signal output circuit configured to output an invalidation signal, if the supply current is determined, in the current determination, to exceed the threshold; and a gate circuit configured to output, as an ON/OFF signal: (i) the switching signal output by the calculation unit, while the invalidation signal output circuit outputs no invalidation signal; or (ii) a signal indicating that at least one of the switching elements is to be turned off, while the invalidation signal output circuit outputs the invalidation signal, and the at least one of the switching elements is configured to be turned on or off in accordance with the ON/OFF signal.

9. The laser oscillator of claim 5, wherein the control unit includes:

a calculation unit configured to output a switching signal to bring the value measured by the current measurement unit closer to a target value;

an invalidation signal output circuit configured to output an invalidation signal, if the supply current is determined, in the current determination, to exceed the threshold; and a gate circuit configured to output, as an ON/OFF signal: (i) the switching signal output by the calculation unit, while the invalidation signal output circuit outputs no invalidation signal; or (ii) a signal indicating that at least one of the switching elements is to be turned off, while the invalidation signal output circuit outputs the invalidation signal, and the at least one of the switching elements is configured to be turned on or off in accordance with the ON/OFF signal.

10. A direct diode laser processing machine comprising the laser oscillator of claim 1.

11. A direct diode laser processing machine comprising the laser oscillator of claim 2.

* * * * *